United States Patent [19]

Ogura et al.

[11] Patent Number: 4,648,937
[45] Date of Patent: Mar. 10, 1987

[54] METHOD OF PREVENTING ASYMMETRIC ETCHING OF LINES IN SUB-MICROMETER RANGE SIDEWALL IMAGES TRANSFER

[75] Inventors: Seiki Ogura, Hopewell Junction; Jacob Riseman, Poughkeepsie; Nivo Rovedo, Poughquag; Ronald N. Schulz, Salt Point, all of N.Y.

[73] Assignee: International Business Machines Corporation, Armonk, N.Y.

[21] Appl. No.: 792,931

[22] Filed: Oct. 30, 1985

[51] Int. Cl.[4] ............................................. B44C 1/22
[52] U.S. Cl. ..................................... 156/643; 29/580; 156/646; 156/653; 156/657; 156/659.1
[58] Field of Search ................. 29/580; 156/643, 646, 156/653, 657, 659.1, 662; 148/187

[56] References Cited

U.S. PATENT DOCUMENTS

| | | | |
|---|---|---|---|
| 4,093,503 | 6/1978 | Harris et al. | 148/187 |
| 4,209,349 | 6/1980 | Ho et al. | 148/187 |
| 4,354,896 | 10/1982 | Hunter et al. | 156/643 |
| 4,358,340 | 11/1982 | Fu | 156/643 |
| 4,385,975 | 5/1983 | Chu et al. | 156/643 |
| 4,432,132 | 2/1984 | Kinsbron et al. | 156/643 |
| 4,449,287 | 5/1984 | Maas et al. | 29/580 |

Primary Examiner—Ivars Cintins
Attorney, Agent, or Firm—Sughrue, Mion, Zinn, Macpeak, and Seas

[57] ABSTRACT

In the process of sidewall image transfer, a vertical step is etched in some material and then a conformal layer of some other material is deposited over the step. By reactive ion etching the conformal material can be anisotropically etched which results in a sidewall spacer of the second material on the vertical surfaces of the step material. By removing the step material, the free standing spacer can then be used as a mask. One area in which improvement is desired is in the selectivity of the etch of the spacer to the material immediately below it. Because of the limited number of materials and reactive ion etching gases it is difficult to avoid an etch in the underlying layer as the sidewall spacer is formed. A suitable etch stop is employed beneath the step material to avoid the problem. Because of the usual technology, the spacer material is plasma deposited silicon nitride and the step material is photoresist. Polysilicon, aluminum or similar metal is employed as an etch stop, since it is not by a CF$_4$ based gas which is used to form the spacer.

18 Claims, 20 Drawing Figures 4,648,937

METHOD OF PREVENTING ASYMMETRIC ETCHING OF LINES IN SUB-MICROMETER RANGE SIDEWALL IMAGES TRANSFER

TECHNICAL FIELD

The invention relates to a method of eliminating asymmetric etchings of lines in sidewall image transfer in the manufacture of structures with dimensions in the sub-micrometer range. This invention is also directed to making a deep dielectric isolation trenches having sub-micrometer width in a silicon body.

BACKGROUND OF THE INVENTION

A number of techniques are known to increase the performance and integration density of integrated circuits. Considerable increases of integration density have recently been achieved mainly by decreasing photolithographic defect densities. The use of electron and X-ray exposure methods instead of the hitherto used light radiation provides higher optical resolution. Techniques to reach very narrow line widths in the 1 $\mu$m range and less by extending conventional lithographic processes while avoiding the cost-intensive techniques of electron and X-ray lithography are also known. With the technique of plasma or reactive ion etching for etching metals, semiconductive and dielectric materials further developments have occurred in the direction of very narrow widths, and consequently toward increased performance and integration density.

A number of publications and patents describe the so-called sidewall technology by means of which structures in the sub-micromater range can be made. In IEEE Electron Device Letters, Vol. EDL2, No. 1, January 1981, pp. 4 to 6, a method is described where vertical (anisotropic) dry etching methods are applied for making MOSFETs which are defined by an edge and have dimensions in the sub-micrometer range. The technology described permits the production of physical channel lengths of the MOSFETs in the 0.1 to 0.15 $\mu$m range.

U.S. Pat. No. 4,358,340 describes a method of making sub-micrometer devices, but without using the sub-micrometer lithography, where a conductive thin film with dimensions in the sub-micrometer range is deposited across a vertical step between adjacent surfaces of an isolation, and subsequently vertically etched until there only remains that part of the conductive film which is adjacent the vertical step. The remaining isolation not covered by the conductor is removed, thus obtaining a gate of an MOS field effect transistor with a width in the sub-micrometer range which equals the layer thickness of the originally applied thin film.

U.S. Pat. No. 4,209,349 describes a method of forming very small mask openings for making semiconductor circuit arrangements. According to this method, first insulator regions are formed on a substrate so that substantially horizontal as well as substantially vertical surfaces are obtained. A second insulator layer is applied thereon of a material different from that of the first insulator layer, and it is subjected to a reactive ion etching process in such a manner that the horizontal regions of the second insulator layer are removed, with merely very narrow regions of this layer remaining on the vertical surface regions of the first insulator layer, and the respective regions of the substrate, respectively. Subsequently, the exposed substrate regions are thermally oxidized, and for finally forming the desired mask openings the regions of the second insulating layer there are removed. By means of this method, minimum dimensions smaller than those of hitherto applied photolithographic methods are to be obtained.

In the process of U.S. Pat. No. 4,209,349, the first insulator layer (silicon dioxide) determines the position and thickness of the mask (column 2, line 62). All openings in the insulator layer are made by standard photolithography and etching techniques (column 3, line 21) according to which no vertical sidewalls can be made. In the method as disclosed by the invention, however, a polymeric layer determines position and thickness of the mask. In the method of the U.S. patent, only hot processes are applied, e.g., the chemical vapor deposition of silicon nitride at approximately 1000° C. (column 5, line 69), whereas in the method as disclosed by the invention so-called cold processes at less than 300° C. are performed permitting a more universal application of the method. With the method of the U.S. patent, masks with a layer thickness of less than 0.5 $\mu$m can be made which are not suitable as masks, e.g., for etching deep trenches. With the method as disclosed by this patent, however, masks with a thickness of 2 to 3 $\mu$m can be made that can be used for etching 4 to 5 $\mu$m deep trenches in a silicon substrate. From thermal oxidation (column 4, line 64 of the U.S. patent), there results an asymmetrical mask with the bird's beak problem being involved which originates from the forming of a nonplanar silicon dioxide on the trench surface, so that the mask cannot be used for trench etching also for that reason. The mask made in accordance with the invention has strictly vertical sidewalls and is of a symmetrical structure.

A feature common to all these known methods is that for making structures with vertical sidewalls and dimensions in the sub-micrometer range materials as polysilicon, silicon nitride or silicon dioxide are used which are all deposited at higher temperatures. Problems associated with high temperature fabrication are well documented in this field.

Another problem in the process of sidewall image transfer is the difficulty of avoiding etching into the underlying layer upon which a spacer is formed. This can be explained by referring to FIGS. 1 and 2. Basically, as illustrated in FIG. 1A, the vertical step is first etched into some material and then as illustrated in FIG. 1B, a conformal layer of another material, a spacer material is deposited over the first material. By the use of reactive ion etching (RIE), etching of the space material is done anisotropically. This results in a leftover spacer of a second material formed against the edge of the step material. Such is illustrated in FIG. 1C.

The step material is then removed as illustrated in FIG. 1D such that only the spacer, now free standing remains. This is illustrated in FIG. 1D. The free standing spacer can then be used as a mask to etch away an underlying layer as illustrated in FIG. 1E.

This technique, while broadly demonstrated, has problems in terms of the selectivity of the etch of the spacer to the material immediately below it. There are a limited number of materials and RIE etch gases and therefore it is difficult to avoid etching into the underlying layer as the spacer is formed. FIG. 2A illustrates an idea or technique where etching of the spacer material stops at the material beneath it. In FIG. 2A, the dotted line indicates the original thickness of the spacer material with the arrows indicative of the ideal depth of etch. Such ideally, therefore, conforms to that illustrated in FIG. 1C. In fact, however, the etch, usually CF4, causes a step or offset from one side of the spacer to the other side in the underlying layer. Such is illustrated in FIG. 2B. The step occurs because one side of the spacer is covered by the step material, but the other side is exposed to the etching. The problem is exacerbated by the need for longer over-etch times as nonuniformity of the RIE system and spacer material deposition system occurs. When the step material is removed, the resulting structure is illustrated in FIG. 2C. Thus, when the step material is removed, the offset will be propagated into whatever layer is beneath the underlying material. This occurs as the underlying material is etched with one side being thicker than other other. The offset is illustrated in FIG. 2D.

For purposes of illustration, example is the fabrication of an FET. The underlying layer is $SiO_2$ with polysilicon directly beneath it. Disposed beneath the polysilicon layer is a thin, approximately 140 angstroms, gate oxide. Given the known technology as one side of the polysilicon completes the etch cycle, the other side does not. Thus, over-etching begins to cutoff the gate oxide. The gate oxide is etched through, the silicon beneath is etched quickly. The result is an asymmetry in the device. Such is illustrated in FIGS. 2E and 2F.

Technology that addresses this problem is represented by U.S. Pat. Nos. 4,432,132 and 4,449,287. In neither, however, is the problem of avoiding the deep or offset effectively dealt with. Other technology directed more broadly to sub-micron technology is represented by U.S. Pat. Nos. 4,093,503, 4,354,896, and 4,385,975. While generally of interest, those references also do not solve the problem set forth and explained relative to FIG. 2.

SUMMARY OF THE INVENTION

Given deficiencies in the prior art, it is an object of this invention to provide the necessary selectivity of the etch of the spacer to the material which is immediately below it. In accordance with this invention, an etch stop is placed beneath the step material. Typically, the spacer material is a plasma deposited silicon nitrite and the step material is a photoresist. In accordance with this invention, polysilicon or aluminum or a similar metal is used as an etch stop since it will be unaffected by the etchant which is used to form the spacer.

It is another object of this invention to form very narrow openings, trenches, by first forming a sub-micron spacer over a metallic layer. When the combination is placed in an oxidizing environment (such as by anodization or exposure to $O_2$ plasma), the exposed metallic layer forms a metallic oxide skin and with the removal of the spacer, etching of the wafer will etch very narrow lines in the exposed metallic layer, making it useful as an etch mask.

This invention will be described in greater detail by referring to the attached drawings and description of the preferred embodiments which follows.

DESCRIPTION OF THE PREFERRED EMBODIMENTS

Figure 1A:
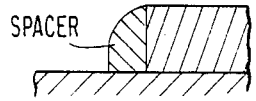
FIGS. 1A through 1E illustrate schematically the process of sidewall image transfer.
Figure 1B:
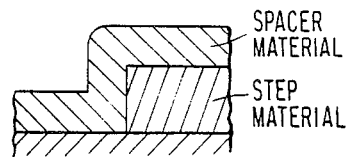
Figure 1C:
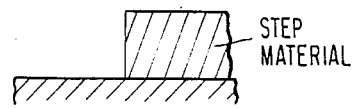
Figure 1D:
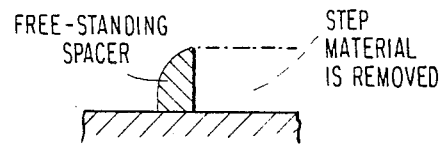
Figure 1E:
Figure 2A:
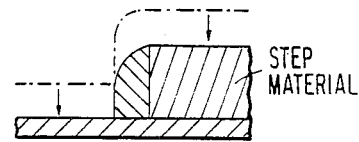
FIGS. 2A through 2F illustrate the process of sidewall image transfer wherein etching in the underlying layer as the spacer forms occurs.
Figure 2B:
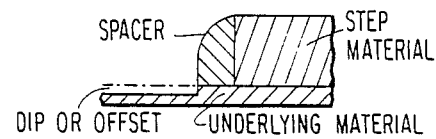
Figure 2C:
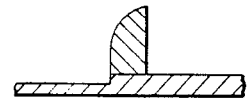
Figure 2D:
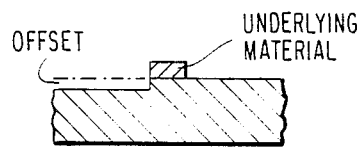
Figure 2E:
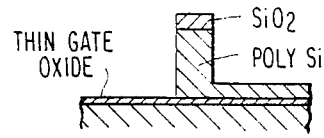
Figure 2F:
Figure 3A:
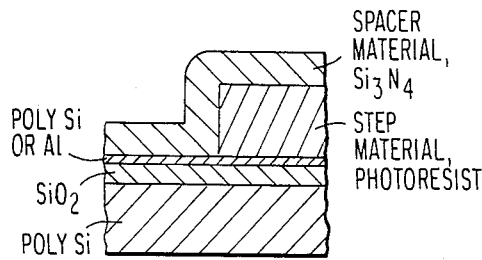
FIGS. 3A through 3E illustrate a first preferred embodiment of this invention which avoids etching in the underlying layer as the spacer is formed.

Referring now to FIGS. 3A through 3E, a preferred embodiment of this invention is illustrated which avoids etching in the underlying layer as the spacer is being formed. Broadly, this invention employs a suitable etch stop beneath the step material. Generally, the etch stop may be either polysilicon, aluminum or a similar metal. The spacer material is a plasma $Si_xN_yO_z$, typically $Si_3N_4$ and the step material is a photoresist. Such is illustrated in FIG. 3A. With those materials, in this example aluminum provides a suitable etch stop since it is not affected by the etchant, typically $CF_4$ which is used to form the spacer. The aluminum layer illustrated in FIG. 3A is very thin and typically not more than 1,500 Å.

Figure 3B:
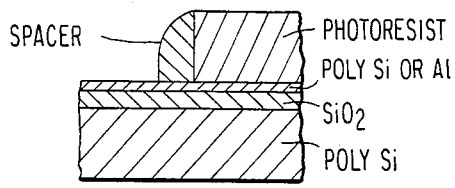

As illustrated in FIG. 3A, aluminum is deposited on top of a $SiO_2$ layer which in actuality is the mask for the polysilicon below it. In accordance with this technology, the oxide layer is patterned by the spacer. As illustrated in FIG. 3B, spacer material is etched away; however, the aluminum will not etch in $CF_4$. Thus, the RIE technique to form the spacer will not offset the two sides of the spacer given the presence of the aluminum etch stop.

Figure 3C:
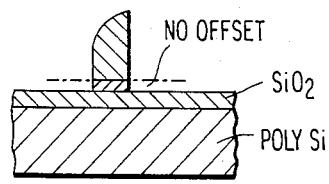
Figure 3D:
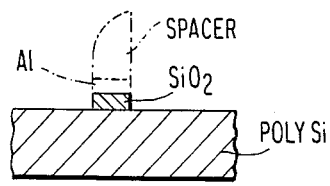
Figure 3E:
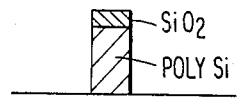

FIG. 3C illustrates the next step, a quick chlorine-based RIE ($CCl_4$ or $Cl_2$) which anisotropically etches the aluminum, and which however, has no effect on the underlying $SiO_2$. Next, a further etch by RIE of the $SiO_2$ is employed. The resulting structure is illustrated in part in FIG. 3D. The structure of 3D is completed by having an aluminum wet etch to "pop off" the spacer and the remaining aluminum underlayer. This leaves only an oxide line of $SiO_2$ on top of the polysilicon layer. This is, the wet etch of the aluminum undercuts the spacer lifting it off while not affecting the $SiO_2$. As illustrated in FIG. 3, there is no offset on either side of the oxide line. Consequently, by the practice of this technology, the resulting sidewall structure has a very narrow, sub-micrometer dimension mask structure formed in the insulating layer. The resulting mask structure may be used to form a number of sub-micron structures by etching diffusion, ion implantation or the like, into the body. Such are accomplished without the problems of step or offset in the underlying material, a significant problem of the prior art.

As set forth herein, polysilicon may also be used as an etch stop. Processing using polysilicon is substantially the same as in the case of a metal. The RIE would be a $Cl_2$ based etchant and no wet etch step is necessary to "pop off" the spacer. The spacer would be removed in hot phosphic acid and the polysilicon layer would be removed at the same time the thicker polysilicon underlying layer is removed.

Referring now to FIGS. 4A through 4D, the technique of forming thin trenches of the sub-micron range will be described. As set forth herein, in accordance with this invention, a material which does not form a volatile reaction product with the constituents of the plasma will not be etched in that plasma. Thus, a fluorine-containing plasma such as $AlF_3$ is a potential product of Al. It is nonvolatile and thus will not etch. There are numerous materials which can be used as an etch-stop in this manner. For example, chromium could be used in the case of both F and Cl containing plasma. It is noted, however, that $O_2$ must be absent. Other material such as $MgF_2$ and $CoF_2$ may also be utilized.

Figure 4A:
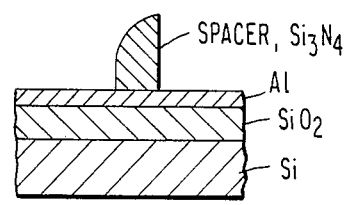
FIGS. 4A through 4D illustrate another preferred embodiment emloying the technique of forming narrow sub-micron trenches utilizing this invention.
Figure 4B:
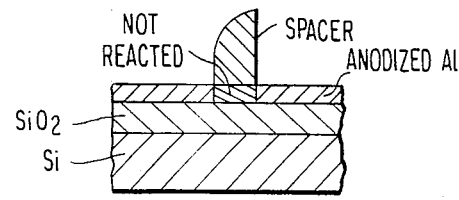
Figure 4C:
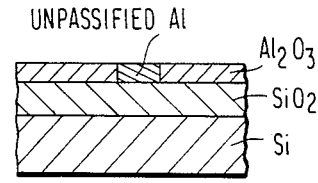
Figure 4D:
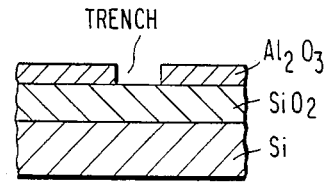

With this general methodology, it is possible to form a sidewall structure as an intermediate step in the ultimate formation of narrow trenches of the sub-micron range. In FIG. 4A, the sidewall structure is described relative to FIG. 3 is first formed over Al or a similar metal. The composite of the spacer and the metal layer is then exposed for a short time to an oxidizing environment such as in anodization, leaving the underlying Al unaffected. Such is illustrated in FIG. 4B. A "skin" of $Al_2O_3$ is formed ecxept where the spacer is present. Removal of the spacer is then accomplished by plasma or chemical removal techniques. Typically, hot $H_3PO_4$ can be used at a controlled temperature to remove only the spacer and not the $Al_2O_3$ skin. Such is illustrated in FIG. 4C. The result is the now exposed Al together with a $Al_2O_3$ skin. Etching of the wafer, typically by a known Al etch will then etch narrow lines patterned on the exposed unpassivated Al. Thus, the passivated Al layer is useful as an etch mask and can be used to form a trench. The $Al_2O_3$ and underlying Al is unaffected but can be substantially removed by chemical techniques known in the art.

It is apparent that modifications of this invention can be practiced without departing from the essential scope thereof.

What is claimed is:

1. A method of forming a sub-micrometer dimensional mask structure on a semiconductor substrate comprising:
   forming an insulative layer on a major surface of said substrate;
   forming a stop layer on said insulative layer;
   forming a step material layer at selected areas on said stop layer;
   covering said insulative layer and said step material with a spacer material;
   removing by selective etching, portions of said spacer material to define a vertical spacer at locations where said mask structure is to be present, said selective etching being positively stopped by said stop layer;
   removing by selective etching exposed portions of said stop layer to define a pattern of spacers without any etching of the insulative layer;
   removing said insulative layer to define a pattern of spacers on said major surface of said substrate having a tiered structure of spacer material, stop material and insulative material; and
   removing said spacer material and the remaining stop material under said spacer material to leave a sub-micrometer dimensional mask structure of remaining insulative material.

2. The method of claim 1, wherein said insulative layer is silicon dioxide.

3. The method of claim 1, wherein said stop layer is a metal unaffected by an etchant used to remove said spacer material.

4. The method of claim 3, wherein said stop layer is formed of aluminum.

5. The method of claim 1, wherein said step material is a photoresist.

6. The method of claim 1, wherein said spacer material is plasma deposited $Si_xN_yO_z$.

7. The method of claim 1, wherein said selective etching comprises the steps of the first etching said spacer material by $CF_4$ etchant followed by a chlorine anisotropic etch of said stop layer by reactive ion etching.

8. The method of claim 1, wherein said insulative layer is removed by reactive ion etching.

9. The method of claim 1, wherein said remaining stop material is removed by a wet etch to undercut said spacer while not affecting said remaining insulative material.

10. The method of claim 1 further comprising the step of forming sub-micrometer structures in said substrate.

11. The method of claim 1, wherein said stop layer is polysilicon.

12. The method of claim 1, wherein the step of removing remaining stop material in turn lifts off said spacer material to define a sub-micrometer mask structure of insulative material on a polysilicon substrate.

13. The method of claim 1, wherein said spacer material and said remaining stop material are separately removed with said remaining stop material removed when said substrate is etched.

14. A method of forming a sub-micrometer trench structure on a semiconductor substrate comprising;
   forming an insulative layer on a major surface of said substrate;
   forming a metallic stop layer on said insulative layer;
   forming a step material layer at selected areas on said metallic stop layer;
   covering said insulative layer and said step material with a spacer material;
   removing by selective etching, portions of said spacer material to define a vertical spacer at locations where said trench structure is to be created, said selective etching being positively stopped by said stop layer;
   exposing said spacer and said metallic stop layer to an oxidizing environment to form a passivated layer of metallic stop material except under said spacer;
   removing said spacer to expose remaining unpassivated stop material; and
   etching said substrate using said passivated stop material as a mask to form narrow patterns by removing said remaining unpassivated metallic stop material.

15. The method of claim 14, wherein said metallic stop material is aluminum.

16. The method of claim 14, wherein said spacer is $Si_3N_4$ and said step of removing said spacer is by hot $H_3PO_4$ etch.

17. The method of claim 14, wherein said metallic stop layer is aluminum and said oxidizing environment is anodization.

18. The method of claim 14, wherein said stop material is a photoresist.

* * * * *